(12) United States Patent
Sugiyama et al.

(10) Patent No.: US 6,459,107 B2
(45) Date of Patent: Oct. 1, 2002

(54) PHOTODETECTOR HAVING A MIXED CRYSTAL LAYER OF SIGEC

(75) Inventors: Yoshihiro Sugiyama; Yoshiki Sakuma, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/793,696

(22) Filed: Feb. 27, 2001

(30) Foreign Application Priority Data

Apr. 28, 2000 (JP) ........................................ 2000-131439

(51) Int. Cl.$^7$ ................................................ H01L 1/48
(52) U.S. Cl. ...................... 257/226; 257/184; 257/188; 257/201; 257/432; 257/436; 438/406; 438/458; 438/459

(58) Field of Search ................................. 257/184, 188, 257/201, 432, 436, 437, 40, 181, 186, 461; 385/131; 438/406, 458, 459

(56) References Cited

U.S. PATENT DOCUMENTS

| | | | | |
|---|---|---|---|---|
| 5,917,981 A | * | 6/1999 | Kovacic et al. | 385/131 |
| 6,300,650 B1 | * | 10/2001 | Sato | 257/184 |
| 6,323,108 B1 | * | 11/2001 | Kub et al. | 438/458 |

* cited by examiner

*Primary Examiner*—David Nelms
*Assistant Examiner*—Mai-Huong Tran
(74) *Attorney, Agent, or Firm*—Armstrong, Westerman & Hattori, LLP

(57) ABSTRACT

A photodetector includes a substrate and an optical absorption layer provided on the substrate, wherein the optical absorption layer is formed of a mixed crystal of Si, Ge and C.

7 Claims, 8 Drawing Sheets

PHOTODETECTOR HAVING A MIXED CRYSTAL LAYER OF SIGEC

CROSS-REFERENCE TO RELATED APPLICATION

The present application is based on Japanese priority application No. 2000-131439 filed on Apr. 28, 2000, the entire contents of which are hereby incorporated by reference.

BACKGROUND OF THE INVENTION

The present invention generally relates to semiconductor devices and more particularly to a high-speed photodetector.

Avalanche photodiodes are used extensively in optical fiber telecommunication systems and networks for detection of optical signals. Particularly, the avalanche photodiode of the system InGaAs/InP is capable of detecting optical signals having a transmission rate of as high as 10 Gb/s and is important in optical fiber telecommunication trunk as a high-speed photodetector.

The avalanche photodiode of the InGaAs/InP system uses an InGaAs layer having a lattice matching composition with respect to an InP substrate as an optical absorption layer. The InGaAs layer having such a lattice matching composition has a photosensitivity for optical radiation at the wavelength of 1.55 μm, wherein the wavelength of 1.55 μm is used extensively in the art of optical fiber telecommunication in view of minimum transmission loss of optical signals transmitted therethrough.

An avalanche photodiode has an additional advantageous feature of reduced carrier transit time associated with the use of a SAM (separated absorption and multiplication) structure for the carrier multiplication layer of InP. As a result of the reduced carrier transit time, the response speed of the photodiode is improved substantially.

FIGS. 1A and 1B show a cross-sectional view and a band structure of a conventional InGaAs/InP avalanche photodiode 10.

Referring to FIG. 1A, an optical absorption layer 12 of n-type InGaAs is formed on a substrate 11 of n⁺-type InP epitaxially, and a carrier multiplication layer 13 of n⁻-type InP is provided on the optical absorption layer 12 epitaxially. Further, a biasing layer 14 of p-type InP is formed on the carrier multiplication layer 13 and a guard ring 14A of p⁺-type InP is formed in the biasing layer 14 so as to surround an optical path of an incident optical beam.

In operation, a reverse bias voltage is applied across the InP substrate 11 and the guard ring 14A with such a magnitude that the carrier multiplication layer 13 is biased to the point near avalanche breakdown, and excitation of electron-hole pairs is caused in the optical absorption layer 12 in response to irradiation of the incident optical beam.

The electrons thus excited are immediately absorbed by an electrode provided on the InP substrate 11, while the holes are transported toward the biasing layer 14 through the carrier multiplication layer 13 while being accelerated by the electric field induced by the reverse bias voltage. Thereby, each of the accelerated holes causes a collision with the crystal lattice of the carrier multiplication layer 13, and such a collision induces a subsidiary excitation of electron-hole pairs.

The electrons thus excited by the collision are absorbed by the electrode on the InP substrate 11, while the holes are transported through the carrier multiplication layer 13 toward the foregoing biasing layer 14 while being accelerated by the reverse bias voltage. Thus, each of the accelerated holes undergoes a collision and causes further excitation of electron-hole pairs. In other words, there occurs carrier multiplication of carriers in the carrier multiplication layer 13 as a result of the reverse biasing.

Thus, such an avalanche photodiode has a gain and can amplify a photocurrent. Because of this, it becomes possible to reduce the load of a pre-amplifier that is provided behind the photodiode for processing an output signal thereof, by using an avalanche photodiode for optical detection. Because of the foregoing advantageous feature, the avalanche photodiode 10 of FIGS. 1A and 1B is used widely in the optical fiber telecommunication system that transmits optical signals with a transmission rate of 10 Gb.

FIG. 2 shows the general construction of an optical fiber telecommunication network that uses the avalanche photodiode 10 for the detection of optical signals.

Referring to FIG. 2, original data 21, which may contain audio and/or video data, is converted into an electrical signal 22, and the electrical signal 22 is used to modulate a laser diode 23 for producing an optical signal. The optical signal thus produced is injected into an optical fiber 24 at a first end and is transmitted therethrough, wherein the optical signal is detected, at the other end of the optical fiber 24, by a photodetector. As a result of photodetection, audio and/or video data 27 corresponding to the original data 21 is reproduced from an output electrical signal 26 of the photodiode 10.

As represented in FIG. 2, the optical fiber 24 has a transmission loss characterized by a minimum loss in the wavelength band (called C-band) between 1530 nm and 1570 nm. Thus, it has been practiced in conventional optical fiber transmission systems to use the foregoing C-band for transmitting optical signals with the conventional transmission rate of 10 Gb/s.

On the other hand, recent widespread use of digital telecommunication as in the case of Internet is causing the problem of sharply increasing signal traffic, and there is emerging a situation in which the use of so-called L-band, which is located between 1570 nm and 1610 nm and has not been used heretofore, is unavoidable.

In the L-band, however, the InGaAs/InP avalanche photodiode, while has been used successfully for the detection of optical signals of the C-band with the transmission rate of 10 Gb/s, cannot provide a satisfactory sensitivity in view of the fact that the fundamental absorption edge of the InGaAs optical absorption layer 12 is located at the wavelength of 1.63 μm (0.76 eV) at room temperature, provided that an InGaAs mixed crystal having a lattice matching composition to the InP substrate 11 is used for the optical absorption layer 12. Thus, in order to continue using the InGaAs/InP avalanche photodiode for the detection of optical signals also in the L-band, it is inevitable to use a high-gain preamplifier for processing the output of the avalanche photodiode.

Further, there is a proposal, in order to deal with the problem of sharp increase of traffic in optical fiber telecommunication systems, to increase the transmission rate of the optical signals from the current rate of 10 Gb/s to 40 Gb/s in the C-band while continuously using the avalanche photodiode of the InGaAs/InP system. This approach, however, raises a problem, associated with the small ionization coefficient ratio of InP, in that it is difficult to reduce the avalanche build-up time in the avalanche photodetector to the degree needed for detecting the optical signal of the transmission rate of 40 Gb/s. It should be noted that the avalanche build-up time is inversely proportional to the ionization coefficient ratio, while the ionization coefficient ratio of InP takes a value of about 1.5 under a practical electric field (6–7×10$^8$V/cm).

Thus, it has been necessary to use a PIN photodiode in combination with an optical amplifier when detecting an optical signal of the C-band and transmitted with the rate of 40 Gb/s. However, such a construction is complex and increases the cost of the optical telecommunication system.

Thus, there has been no practical means for processing the optical signal of the L-band and having the transmission rate of 40 Gb/s.

SUMMARY OF THE INVENTION

Accordingly, it is a general object of the present invention to provide a novel and useful photodetector wherein the foregoing problems are eliminated.

Another and more specific object of the present invention is to provide a high-speed photodetector having a sufficient sensitivity to optical signals of the L-band by using an optical absorption layer having a large ionization coefficient ratio.

Another object of the present invention is to provide a photodetector, comprising:

a substrate; and an optical absorption layer provided on said substrate, said optical absorption layer comprising a mixed crystal of Si, Ge and C.

According to the present invention, the optical absorption layer has a reduced bandgap and the photodetector shows a sufficient photosensitivity against optical signals of the L-band having a longer wavelength. By incorporating C with a concentration of 3% or more in terms of atomic percent, the foregoing mixed crystal forming the optical absorption layer has a direct-transition band structure. By using such a mixed crystal of SiGeC for the optical absorption layer, it is possible to construct any of an avalanche photodiode and a PIN photodiode.

When the SiGeC mixed crystal is used for the optical absorption layer of an avalanche photodiode, it is possible to maximize the response speed by using Si having a large ionization coefficient ratio for a carrier multiplication layer. Thereby, the avalanche photodiode can detect the optical signals not only of the C-band but also of the L-band and having the transmission rate of 40 Gb/s.

Further, it is possible to construct a PIN photodiode by using the SiGeC mixed crystal for the optical absorption layer. In this case, a response speed up to the frequency band of 90 Ghz can be obtained.

Other objects and further features of the present invention will become apparent from the following detailed description when read in conjunction with the attached drawings.

DETAILED DESCRIPTION OF THE INVENTION

FIRST EMBODIMENT

Figures 3A, 3B:
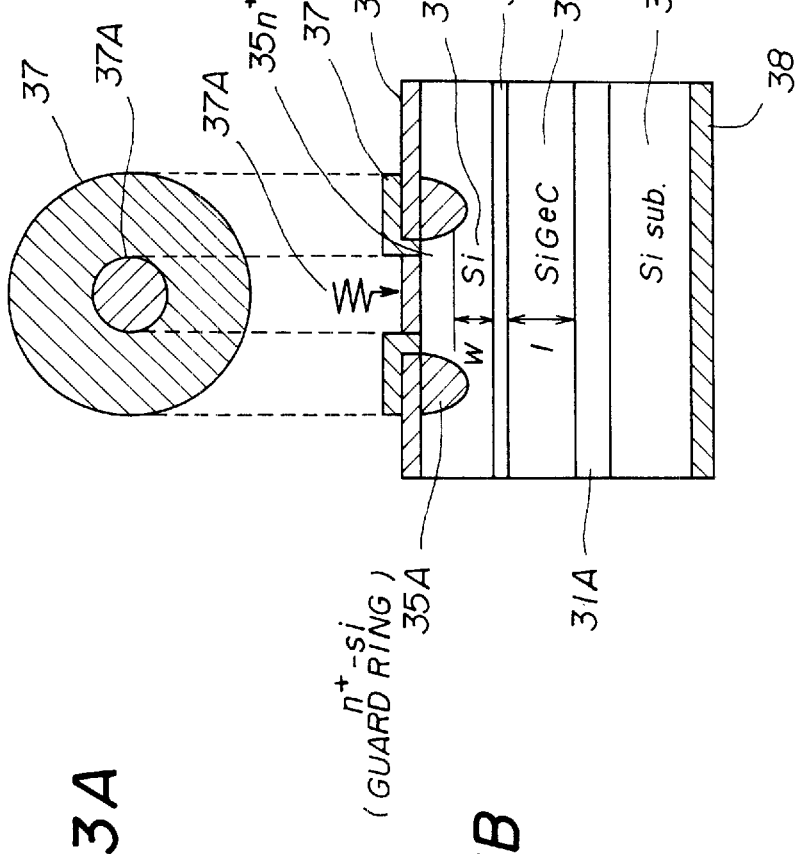
FIGS. 3A and 3B are diagrams showing the construction of an avalanche photodiode according to a first embodiment of the present invention respectively in a plan view and in a cross-sectional view.

FIGS. 3A and 3B show the construction of an avalanche photodiode 30 according to a first embodiment of the present invention respectively in a plan view and in a cross-sectional view.

Referring to the cross-sectional view of FIG. 3B, the avalanche photodiode 30 is constructed on a substrate 31 of p$^+$-type Si having a (001)-oriented principal surface and includes a buffer layer 31A of p$^+$-type Si formed on the Si substrate 31 epitaxially with a thickness of about 200 nm, wherein the buffer layer 31A has a carrier density of 5×10$^{18}$cm$^{-3}$ and a SiGeC mixed crystal layer 32 of p-type is formed on the buffer layer 31A epitaxially with a thickness of about 500 nm.

Typically, the SiGeC mixed crystal layer 32 is doped with B to a carrier density of about 10$^{18}$cm$^{-3}$ and contains C and Ge with respective concentrations of 4% and 32% in terms of atomic percent, wherein the SiGeC mixed crystal layer 32 achieves a substantial lattice matching with the Si substrate 31.

On the SiGeC mixed crystal layer 32, there is provided a graded layer 33 of a SiGeC mixed crystal formed epitaxially with a thickness of about 50 nm, wherein the graded layer 33 is doped to the p-type with a carrier density of about 10$^{17}$cm$^{-3}$ and has a C atomic percent that changes gradually in the thickness direction from 4% at the bottom surface facing the SiGeC mixed crystal layer 32 to 0% at the top surface. As a result of such a gradual change of the C concentration, the atomic percent of Ge changes also in the graded layer 33 from the value of 32% at the bottom surface thereof to the value of 0% at the top surface thereof. In each point in the graded layer 33, the C and Ge concentrations are chosen such that the graded layer 33 achieves a substantial lattice matching with the Si substrate 31.

On the graded layer 33, there is provided a carrier multiplication layer 34 of p$^-$-type Si epitaxially with a thickness of about 700 nm, and a region of n$^+$-type is formed on a surface part of the carrier multiplication layer 34 in correspondence to the path of the incident optical beam with a depth of about 200 nm. Thus, the carrier multiplication layer 34 has a thickness w of about 500 nm in the region right underneath the foregoing n$^+$-type region 35.

Further, the foregoing n$^+$-type region 35 is surrounded by a guard ring 35A of n$^+$-type formed in the carrier multiplication layer 34, and a ring-shaped electrode 37, typically formed of Al, makes a contact with the guard ring 35A. As represented in the plan view of FIG. 3A, the electrode 37 is formed so as to surround a region 37A corresponding to the optical path of the incident optical beam. Alternatively, a suicide region may be formed in correspondence to the electrode 37. Further, a bottom electrode 38 is provided on the bottom surface of the substrate 31.

It should be noted that the Si buffer layer 31A or the Si multiplication layer 34 can be formed by an ordinary CVD process that uses $SiH_4$ as a gaseous source and $B_2H_6$ as a gaseous dopant. On the other hand, the optical absorption layer 32 or the graded layer 33 of the SiGeC mixed crystal can be formed by a CVD process that uses $GeH_4$ and $SiH_3CH_3$ as the gaseous sources of Ge and C, in addition the gaseous source of $SiH_4$. An ion implantation process of $As^+$ or $P^+$ may be used for forming the $n^+$-type region 35 and the guard ring 35A. Further, it is possible to form the SiGeC mixed crystal layer 32 and 33 also by an MBE process.

Further, the $n^+$-type region 35 may be formed by depositing a Si layer doped with As or P, or alternatively a glass layer containing P such as PSG, followed by causing a diffusion of P or As therefrom.

Figure 4:
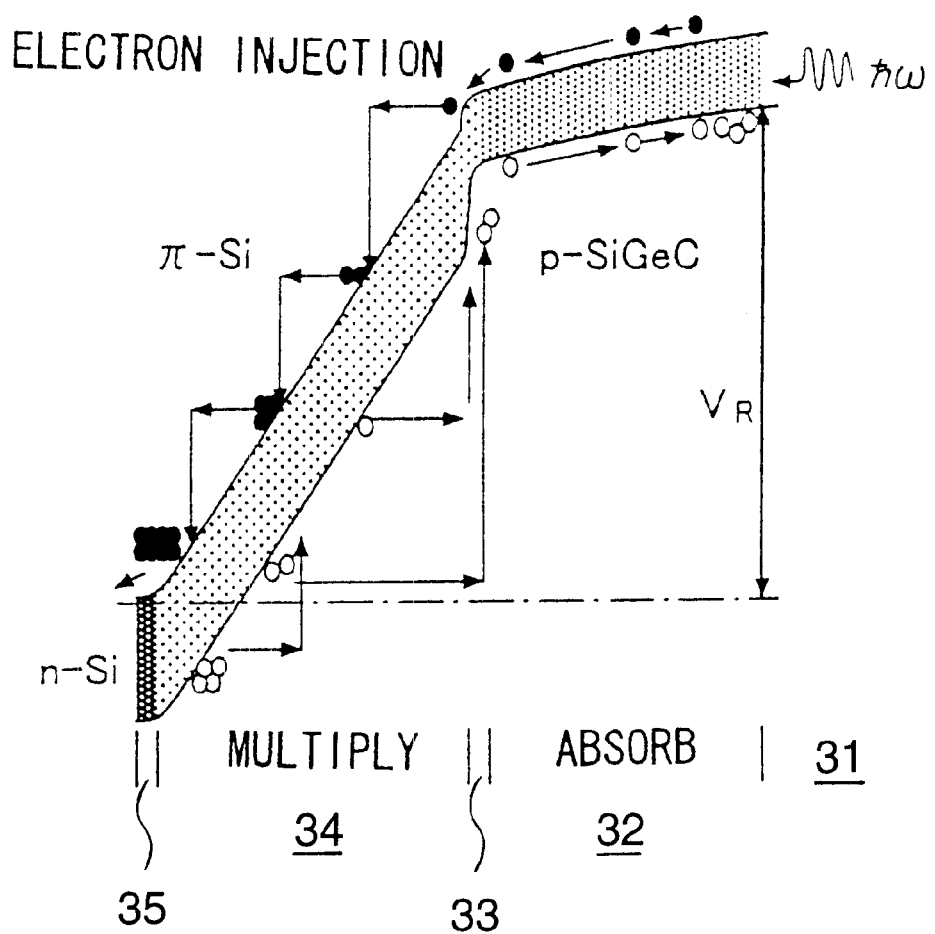
FIG. 4 is a diagram showing the band structure of the avalanche photodiode of FIG. 3.

FIG. 4 shows the band structure of the avalanche photodiode of FIGS. 3A and 3B for the state in which a reverse bias voltage near the point of avalanche breakdown is applied.

Referring to FIG. 4, the optical beam incident to the SiGeC optical absorption layer 32 through the region 37A induce an excitation of electrons and holes, wherein the holes thus excited are immediately absorbed by the electrode 38 via the Si substrate 31.

On the other hand, the electrons formed as a result of the optical excitation are injected into the carrier multiplication layer 34 via the graded layer 33 and are transported toward the $n^+$-type region 35 while being accelerated by the strong electric field induced in the carrier multiplication layer 34. Thereby, the electrons cause a collision with the crystal lattice of the carrier multiplication layer 34, and excitation of electron-hole pairs is caused as a result of the collision. The electrons thus excited cause further excitation of electron-hole pairs, and there occurs a desired multiplication of the photo-carriers as the collision spread in the multiplication layer 34.

Figure 5:
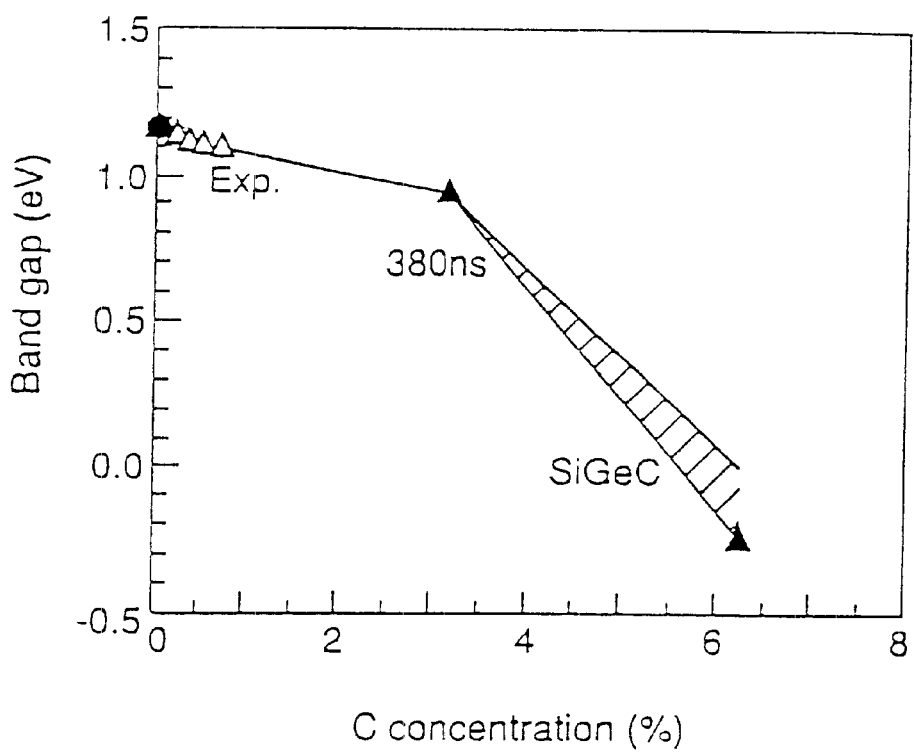
FIG. 5 is a diagram showing the relationship between the bandgap of a SiGeC mixed crystal and a C concentration therein.

FIG. 5 shows the relationship between the bandgap of the SiGeC mixed crystal and the C concentration level therein.

Figure 2:
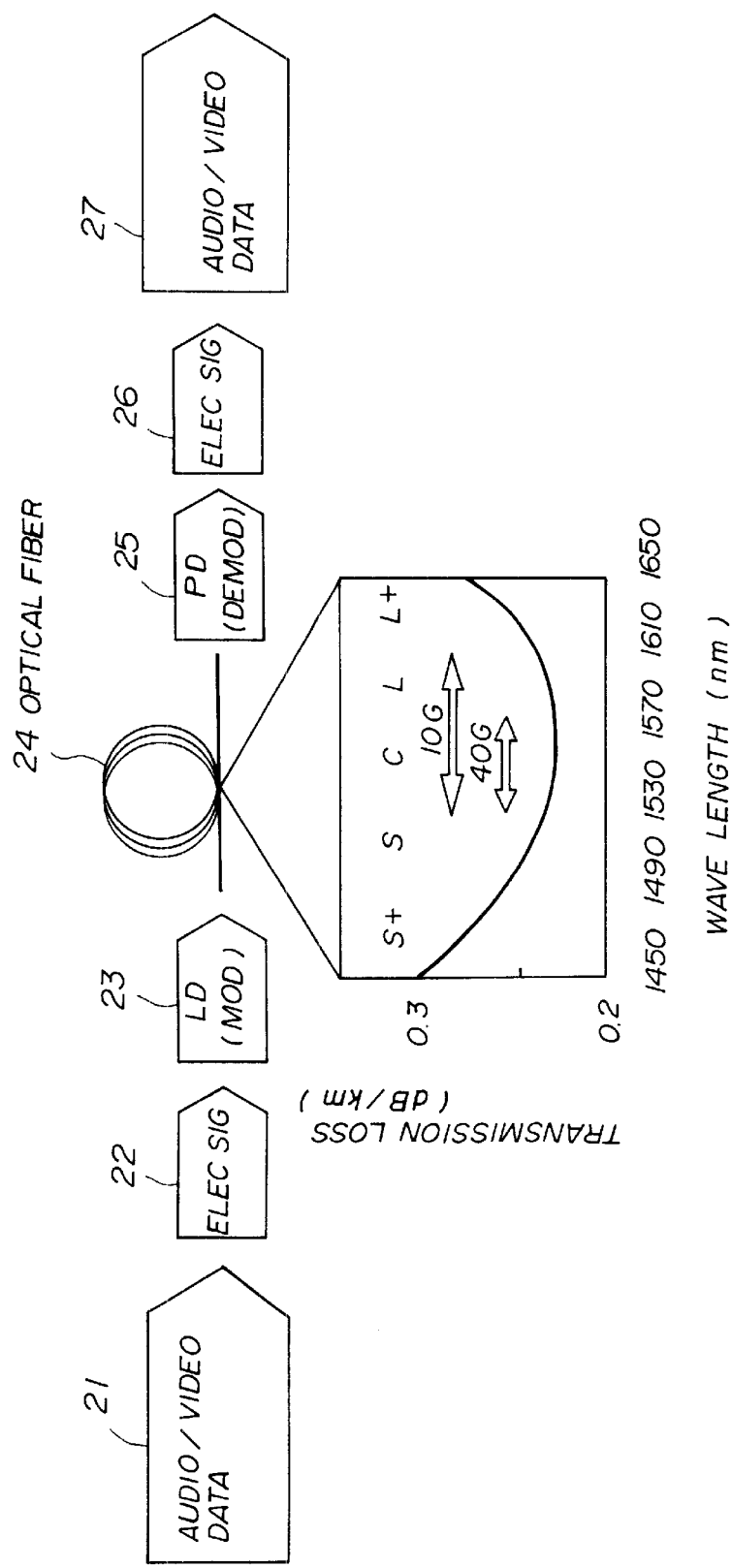
FIG. 2 is a diagram showing the construction of a conventional optical fiber telecommunication network.

Referring to FIG. 5, the SiGeC mixed crystal has the bandgap of 1.12 eV at the Si end-member composition as is well known from the bandgap of Si, it can be seen that the bandgap decreases rapidly when the C concentration in the SiGeC mixed crystal has exceeded the value of about 3 at%, and a bandgap of about 0.76 eV (1.63 μm) is achieved at the C concentration of 3.7 at%. With the decrease of the bandgap, the fundamental absorption edge of the optical absorption layer shifts in the longer wavelength side. Thus, it is possible to construct an avalanche photodiode having a photosensitivity in the L-band explained with reference to FIG. 2, by using the SiGeC mixed crystal containing C with the concentration of 3.7 at% or more.

Figure 6:
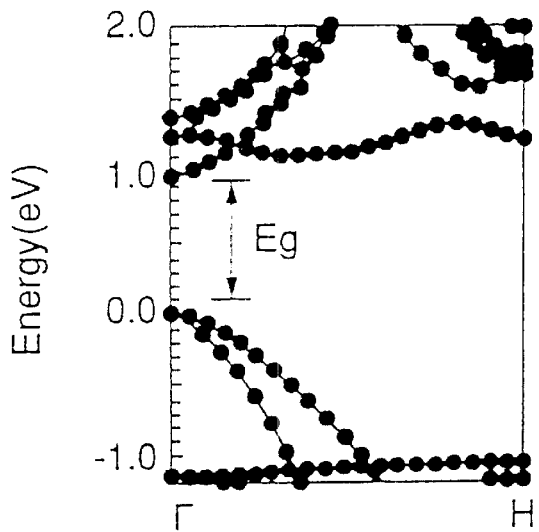
FIG. 6 is a band diagram of a SiGeC mixed crystal.

FIG. 6 shows the band structure of a SiGeC mixed crystal for the case the SiGeC contains C with the concentration level of 3.1 at%. Thereby, the SiGeC of FIG. 6 has a lattice-matching composition that achieves a lattice matching with respect to Si.

Referring to FIG. 6, the SiGeC mixed crystal has a band structure of direct-transition type in the case the mixed crystal contains C with a concentration of 3.1 at% or more. Thus, in the case a SiGeC mixed crystal containing C with the concentration of 3.1 at% or more is used for the optical absorption layer 32 of the avalanche photodiode 30 of FIGS. 3A and 3B, there occurs direct and efficient excitation of photo-carriers without the need of intervention of phonons.

Because of the efficient optical excitation of the carriers, the avalanche photodiode 30 can reduce the thickness of the optical absorption layer 32, while the decrease of thickness of the optical absorption layer results in a decrease of transit time of the optically excited carriers through the optical absorption layer 32 and hence improvement of response speed of the avalanche photodiode 30.

Figure 7:
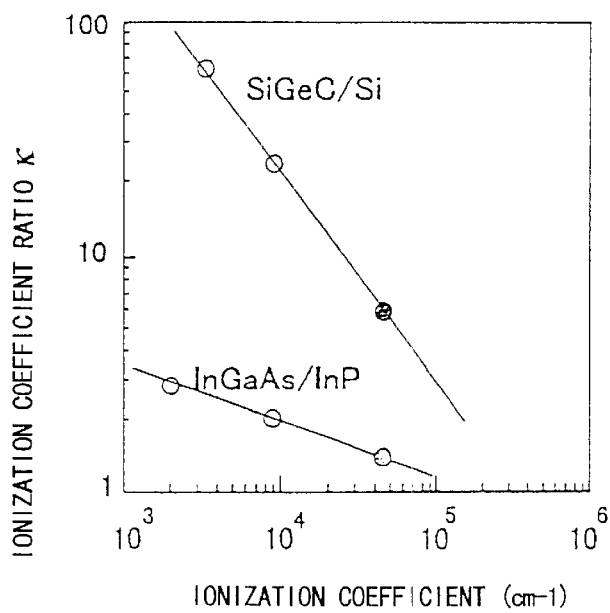
FIG. 7 is a diagram showing the relationship between an ionization coefficient ratio and the ionizing coefficient for an avalanche photodiode that uses the structure of SiGeC/Si in comparison with an avalanche photodiode that uses the structure of InGaAs/InP.

FIG. 7 shows the relationship between the ionization coefficient and the ionization coefficient ratio for the system of SiGeC/Si in which a SiGeC mixed crystal layer is provided on the Si layer, wherein the vertical axis of FIG. 7 represents the ionization coefficient ratio κ while the horizontal axis represents the ionization coefficient. FIG. 7 further shows the ionization coefficient ratio for the system of InGaAs/InP for the purpose of comparison.

Referring to FIG. 7, it can be seen that the ionization coefficient ratio for the SiGeC/Si system is much larger than the ionization coefficient ratio of the InGaAs/InP. For example, a value of about 1.4 is obtained for the InGaAs/InP system at the ionization coefficient of $6 \times 10^5$ $Vcm^{-1}$, while the system of SiGeC/Si provides the value of as much as 6 at the ionization coefficient of $4 \times 10^5$ $Vcm^{-1}$.

Generally, the response speed of an avalanche photodiode is given, in terms of a time constant τ as $$\tau = M \cdot \tau_m + \tau_a + \tau_{CR},$$

$$1/\tau_m = N(\kappa) \cdot \kappa \cdot V_m / W,$$

$$\tau_m = t/V_a,$$

wherein M represents the multiplication factor, $\tau_m$ represents the avalanche build-up time, $\tau_a$ represents the carrier transit time of the carriers through the optical absorption layer 32, $\tau_{CR}$ represents a device time constant, w represents the thickness of the carrier multiplication layer 34, $V_m$ represents the carrier drift velocity in the carrier multiplication layer 34, t represents the thickness of the optical absorption layer 32, $V_a$ represents the carrier drift velocity optical absorption layer 32, κ represents the ionization factor ratio of the carrier multiplication layer 34, and N(κ) is a function defined as being not sensitive to the parameter κ. More specifically, the function N(κ) is defined to take the value of ⅓ (N=⅓) when the parameter κ takes the value of 1 (κ=1) and the value of 2 (N=2) when the parameter κ takes the value of 1000 (κ=1000). Here, the parameter κ is defined as taking a value larger than 1 (κ>1). See Emmons, R. B., J. Apply, Phys. vol. 38, 1967, pp. 3705. Shorter the time constant τ, larger the response speed of the avalanche photodiode and hence the operational band thereof.

It should be noted that the foregoing relationship indicates that the response speed of an avalanche photodiode is primarily determined by the avalanche build-up time $\tau_m$, carrier transit time $\tau_a$ and the device time constant $\tau_{CR}$. By optimizing the device structure, it is possible to reduce the device time constant $\tau_{CR}$ to be 0.8 ps or less. Thus, the remaining factors, in other words the avalanche build-up time $\tau_m$, and the carrier transit time $\tau_a$, are the major factors that limit the operational speed of the avalanche photodiode.

From the foregoing equation, it can be seen that the avalanche build-up time $\tau_m$ can be reduced by increasing the ionization coefficient ratio κ of the carrier multiplication layer 34 and by increasing the carrier drift velocity $V_m$. For example, the avalanche photodiode 30 of the present embodiment that uses Si for the carrier multiplication layer 34 has the ionization coefficient ratio κ of 4.3 times (=6/1.4) as large as the case in which InP is used for the carrier multiplication layer 34. Further, there occurs an increase of the drift velocity $V_m$ in the avalanche photodiode 30 of the present embodiment, associated with the use of Si for the carrier multiplication layer 34, up to the value of $1.05 \times 10^7$ cm/s in the range of the electric field strength of $4–6 \times 10^5$ V/cm, while this value of drift velocity $V_m$ is substantially larger than the drift velocity $V_m$ of $0.86 \times 10^7$ cm/s, which is obtained when InP is used for the carrier multiplication layer 34.

Figure 1A:
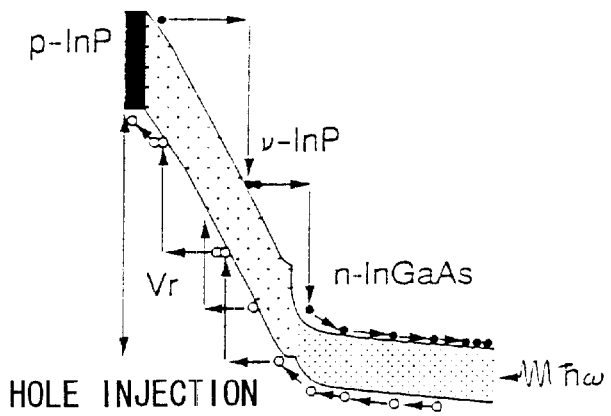
FIGS. 1A and 1B are diagrams respectively showing the band structure and the construction of an avalanche photodiode of the InGaAs/InP system.
Figure 1B:
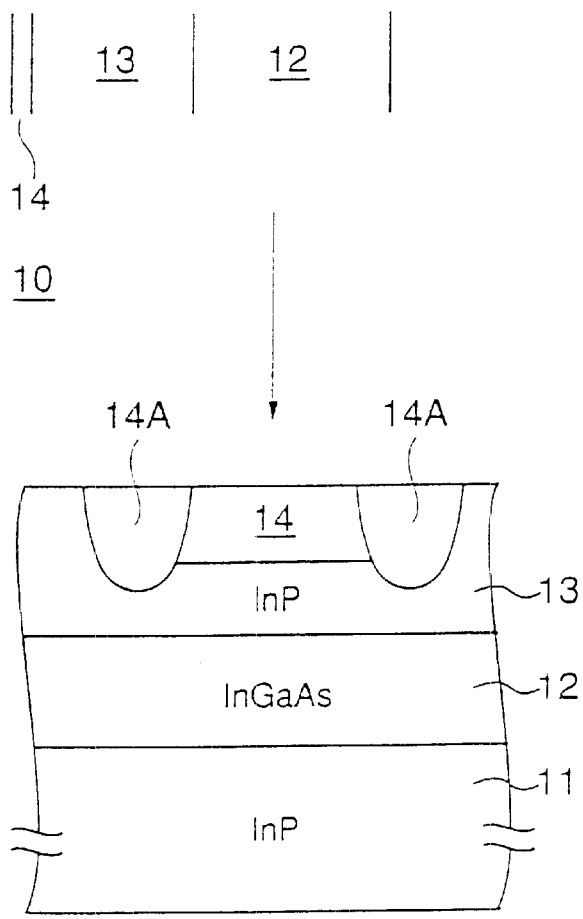

As a result, the avalanche build-up time τm of the avalanche photodiode 30 is reduced by a factor of ⅓ or less as compared with the avalanche photodiode 10 of FIGS. 1A and 1B. In the foregoing consideration, it should be noted that the drift velocity $V_m$ of the carriers represents the average of the electron drift velocity and the hole drift velocity.

In the avalanche photodiode 30 of FIGS. 3A and 3B, it should be noted further that, because of the larger effective mass of the optically excited electrons in the optical absorption layer 32, which is formed of the SiGeC mixed crystal, as compared with the case in which the optical absorption layer is formed of InGaAs, the excitation of hot electrons is less likely to occur in the optical absorption layer 32 even in such a case a large electric field is induced in the optical absorption layer 32. This in turn means that it is possible to increase the drift velocity $V_m$ of the optically excited electrons by increasing the electric field in the optical absorption layer 32.

In the hypothetical case in which InGaAs is used for the optical absorption layer 32 in the avalanche photodiode of FIGS. 3A and 3B, there would be formed hot electrons easily in the optical absorption layer 32, due to extremely small effective mass m* of electrons of about 0.042 mo in an InGaAs crystal, even when the electric field strength in the optical absorption layer 32 is very small. In such a hypothetical case, the ionization would easily be caused as a result of collision of the hot electrons and the desired increase of the drift velocity $V_m$ and decrease of the carrier transit time $\tau_a$ would be difficult.

Thus, the avalanche photodiode of the present invention achieves a high-speed operation in an expanded wavelength range, as compared with the conventional avalanche photodiode of FIGS. 1A and 1B, by using the SiGeC optical absorption layer 32 in combination with the Si multiplication layer 34. According to the value of the time constant τ thus calculated according to the foregoing equation, it is derived, in view of the relationship $f = 1/(2\pi\tau)$, in that the avalanche photodiode 30 has the upper limit operational frequency of 56 GHz or more, while this upper limit operational frequency is sufficient for guaranteeing the operation of the avalanche photodiode 30 in the L-band with the speed of 40 Gb/s.

In the avalanche photodiode 30 described heretofore, it is also possible to use a quarternary mixed crystal of the Si-Ge-C-Sn system for the optical absorption layer 32 and the graded layer 33 in place of the ternary mixed crystal of the Si-Ge-C system.

SECOND EMBODIMENT

Figure 8:
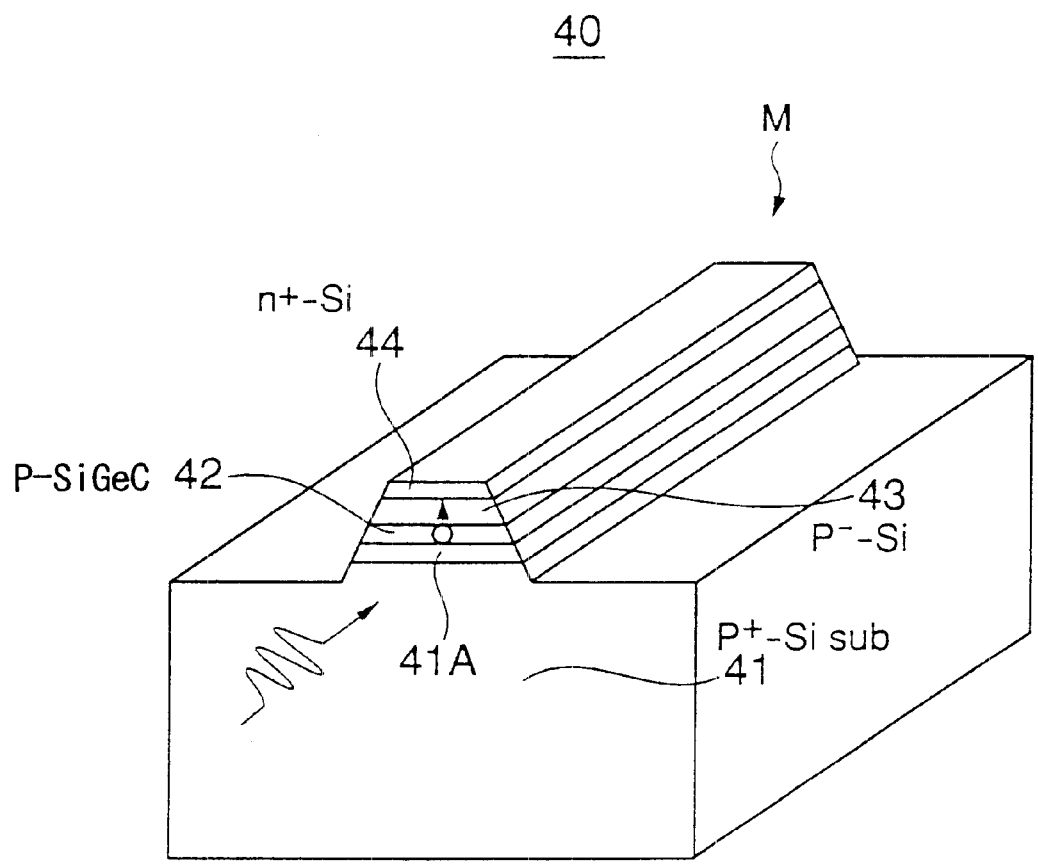
FIG. 8 is a diagram showing the construction of an avalanche photodiode according to a second embodiment of the present invention.

FIG. 8 shows the construction of an avalanche photodiode 40 having a waveguide structure according to a second embodiment of the present invention.

Referring to FIG. 8, the avalanche photodiode 40 is constructed on a substrate 41 of p*-type Si and includes a buffer layer 41A of p*-type Si formed on the Si substrate 41 epitaxially and a SiGeC mixed crystal layer 42 of p-type formed on the buffer layer 41A epitaxially. Further, carrier multiplication layer 43 of p*-type Si is formed epitaxially on the optical absorption layer 42 via an intervening graded layer of a SiGeC mixed crystal not illustrated.

The carrier multiplication layer 43 carries thereon an electrode layer 44 of n⁺-type Si, wherein the electrode layer 44, the carrier multiplication layer 43, the optical absorption layer 42 and a part of the Si substrate 41 form together a mesa region M extending in an axial direction at a central part of the substrate 41.

Further, an upper electrode (not shown) and a lower electrode (not shown) are formed respectively on the electrode layer 44 and on the bottom layer of the Si substrate 41.

In the avalanche photodiode 40 of FIG. 8, it should be noted that the mesa structure M constitutes an optical waveguide of an incoming optical beam and it the optical beam is injected into the optical absorption layer 42 at an end surface of the mesa structure M. In view of the fact that the optical absorption layer 42 contains C with a concentration of about 4 at% or more, the avalanche photodiode of FIG. 8 has a sufficient optical sensitivity not only in the C-band but also in the L-band. Further, the avalanche photodiode has a response speed sufficient for detecting optical signals transmitted with a speed of 40 Gb/s or more. By forming the mesa structure M, the avalanche photodiode 40 has a reduced parasitic capacitance and the device time constant $\tau_{CR}$ is reduced.

By forming the optical absorption layer 42 to have a thickness of 100 nm in the avalanche photodiode 40 of FIG. 8, and further by forming the Si multiplication layer 43 to have a thickness of 190 nm and by forming the mesa structure M to have a width of 5 μm, it is possible to construct a device that has a gin of 10 dB in the wavelength range of C-band and L-band and has a response speed of 50 GHz.

In the case the value of the reverse bias voltage is chosen in the avalanche photodiode 40 of FIG. 8 such that there occurs no substantial multiplication of carriers in the carrier multiplication layer 43, it becomes possible to operate the avalanche photodiode 40 with an even larger operational speed.

In the case the avalanche photodiode 40 is biased as noted above, the total time constant τ of the photodiode 40 is represented, in view of the fact that the carrier multiplication factor M becomes 1, as $$\tau = \tau_m + \tau_a + \tau_{CR}.$$

the parameters $\tau_m$, $\tau_a$ and $\tau_{CR}$ can be reduced to 0.1 ps, 1 ps and 0.7 ps respectively, the avalanche photodiode 40 is theoretically operable up to the speed of 90 GHz.

THIRD EMBODIMENT

Figure 9:
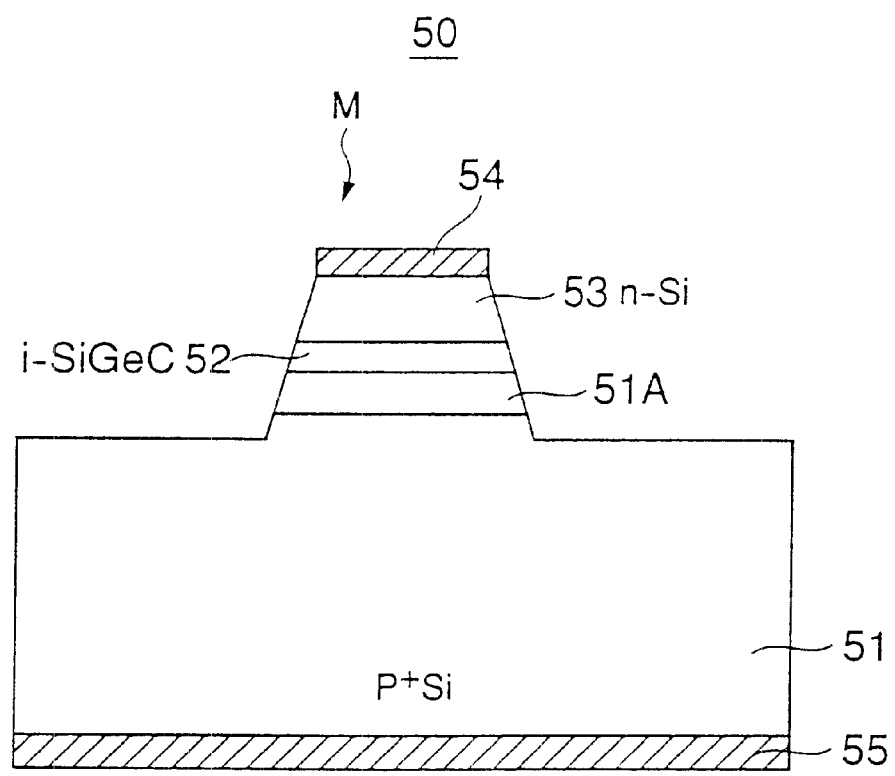
FIG. 9 is a diagram showing the construction of a PIN photodiode according to a third embodiment of the present invention.

FIG. 9 shows the construction of a PIN photodiode 50 according to a third embodiment of the present invention.

Referring to FIG. 9, there is formed an optical absorption layer of an undoped SiGeC mixed crystal on a substrate 51 of p⁺-type Si via a buffer layer 51A of p⁺-type Si, and an electrode layer 53 of n-type Si is formed further on the optical absorption layer 52. A graded layer may be interposed at the interface between the buffer layer 51A and the optical absorption layer 52 and between the optical absorption layer 52 and the electrode layer 53. Further, an upper electrode 54 is provided on the top surface of the electrode layer 53 and a bottom electrode 55 is formed on the bottom surface of the substrate 51.

Similarly to the embodiment of FIG. 8, the photodiode of the present embodiment also includes a mesa structure M so as to extend on the Si substrate 51 in an axial direction, and the incoming optical beam is injected at the end surface of the mesa structure M.

According to the PIN photodiode 50 of the present invention, it becomes possible to detect the optical signals having a transmission rate of 90 GHz similarly to the case of operating the avalanche photodiode 40 of the previous embodiment under the bias condition determined such that there is no gain.

Further, the present invention is not limited to the embodiments described heretofore, but various variations and modifications may be made without departing from the scope of the invention.

What is claimed is:

1. A photodetector, comprising:

a substrate; and an optical absorption layer provided on said substrate, said optical absorption layer comprising a mixed crystal of Si, Ge and C.

2. A photodetector as claimed in claim 1, wherein said optical absorption layer contains C with a concentration of 3% or more in atomic percent.

3. A photodetector as claimed in claim 1, wherein said optical absorption layer comprises a mixed crystal of Si, Ge, C and Sn.

4. A photodetector as claimed in claim 1, wherein said substrate comprises a Si substrate and said optical absorption layer has a composition causing a lattice matching to said Si substrate.

5. A photodetector as claimed in claim 1, wherein said substrate and said optical absorption layer has a first conductivity type, said photodetector further comprising: a carrier multiplication layer formed on said optical absorption layer; a conductive region formed on said carrier multiplication layer with a second, opposite conductivity type; a first electrode electrically connected to said conductive region; and a second electrode electrically connected to said substrate, said carrier multiplication layer and said conductive region comprises a Si layer.

6. A photodetector as claimed in claim 5, further comprising a graded layer of a mixed crystal of Si, Ge and C between said optical absorption layer and said carrier multiplication layer, said graded layer having a concentration profile of C and Ge such that a concentration of C and a concentration of Ge decreases from a first surface at a side of said optical absorption layer to a second surface at a side of said carrier multiplication layer.

7. A photodetector as claimed in claim 1, wherein said substrate has a first conductivity type, said photodetector further comprising a semiconductor layer having a second, opposite conductivity type on said optical absorption layer, said optical absorption layer being an undoped semiconductor layer.

* * * * *